(12) United States Patent
Fujii

(10) Patent No.: US 8,841,175 B2
(45) Date of Patent: Sep. 23, 2014

(54) VERTICAL TRENCH IGBT AND METHOD FOR MANUFACTURING THE SAME

(75) Inventor: Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/619,395

(22) Filed: Sep. 14, 2012

(65) Prior Publication Data

US 2013/0234200 A1 Sep. 12, 2013

(30) Foreign Application Priority Data

Mar. 9, 2012 (JP) ................................. 2012-052580

(51) Int. Cl.
H01L 21/332 (2006.01)

(52) U.S. Cl.
USPC .................... 438/138; 438/133; 257/E21.384

(58) Field of Classification Search
USPC ........................... 438/133, 135, 136, 137, 138
See application file for complete search history.

(56) References Cited

U.S. PATENT DOCUMENTS

| | | | | |
|---|---|---|---|---|
| 4,074,304 A | * | 2/1978 | Shiba | 257/548 |
| 5,488,002 A | * | 1/1996 | Kimura et al. | 438/366 |
| 5,801,408 A | | 9/1998 | Takahashi | |
| 5,960,264 A | * | 9/1999 | Takahashi | 438/133 |
| 6,818,492 B2 | * | 11/2004 | Kubo et al. | 438/202 |
| 2002/0127814 A1 | | 9/2002 | Kubo et al. | |
| 2008/0197442 A1 | | 8/2008 | Hirler et al. | |
| 2012/0028417 A1 | | 2/2012 | Hirler et al. | |

FOREIGN PATENT DOCUMENTS

| | | |
|---|---|---|
| DE | 102007008777 A1 | 8/2008 |
| JP | 08-097226 A | 4/1996 |
| JP | 09-092628 A | 4/1997 |
| JP | 09-246493 A | 9/1997 |
| JP | 2002-198513 A | 7/2002 |
| KR | 10-0250350 B1 | 4/2000 |

OTHER PUBLICATIONS

An Office Action issued by the Korean Intellectual Property Office on Dec. 23, 2013, which corresponds to Korean Patent Application No. 10-2013-0019631 and is related to U.S. Appl. No. 13/619,395; with partial English translation.
An Office Action issued by the German Patent Office on Mar. 20, 2014, which corresponds to German Patent Application No. 10 2012 220166.1 and is related to U.S. Appl. No. 13/619,395; with English language translation.
An Office Action issued by the Korean Patent Office on Jun. 18, 2014, which corresponds to Korean Patent Application No. 10-2013-0019631 and is related to U.S. Appl. No. 13/619,395; with English language partial translation.

* cited by examiner

Primary Examiner — Reema Patel
(74) Attorney, Agent, or Firm — Studebaker & Brackett PC

(57) ABSTRACT

A method for manufacturing a vertical trench IGBT includes: forming a body layer of a second conductivity type on a semiconductor substrate of a first conductivity type; forming a trench passing through the body layer; forming a trench gate in the trench via a gate insulating film; forming a polysilicon film containing an impurity of a first conductivity type on the body layer; diffusing the impurity from the polysilicon film into the body layer to form an emitter layer of a first conductivity type on the body layer; and forming a collector layer of a second conductivity type on a lower surface of the semiconductor substrate.

7 Claims, 8 Drawing Sheets

VERTICAL TRENCH IGBT AND METHOD FOR MANUFACTURING THE SAME

BACKGROUND OF THE INVENTION

1. Field of the Invention

The present invention relates to a vertical trench IGBT (Insulated Gate Bipolar Transistor) and a method for manufacturing the same.

2. Background Art

Conventionally, the emitter layer of a vertical trench IGBT has been formed by impurity injection and heat treatment. For miniaturizing the cell structure of a vertical trench IGBT, the contact structure must use plugs. However, a contact plug has contacted with the semiconductor layer via a thin barrier metal.

In horizontal transistors, the formation of a diffusion layer by impurity diffusion from polysilicon, or the provision of a polysilicon film between a semiconductor layer and a contact plug has been proposed (for example, refer to Japanese Patent Application Laid-Open No. 8-97226, Japanese Patent Application Laid-Open No. 9-246493, and Japanese Patent Application Laid-Open No. 9-92628).

SUMMARY OF THE INVENTION

RBSOA (Reverse Biased Safe Operating Area) represents the non-destructive operation range of the voltage between the collector and the emitter, and the collector current accompanying turning off of the IGBT, and as this range is wide, the non-destructive performance to reverse bias is high. Therefore, the improvement of RBSOA capacities has been desired.

The emitter layer cannot be shallowly formed because of impurity injection and heat treatment. If the width of the emitter layer is miniaturized more than the depth thereof, the emitter layer becomes spherical, and a dimensionally and characteristically stable junction cannot be formed. Especially, in the vertical trench IGBT, the cell structure (cell pitch) is miniaturized, and unless the emitter layer is also miniaturized, holes are accumulated directly below the emitter layer during reverse bias interrupting of the IGBT. When the NPN transistor is turned ON, latch-up operation is started. In addition, when stress is concentrated in the bottom of the contact plug, defects increase in the Si substrate, and leak current increases. As a result, there was a problem of the deterioration of RBSOA capacity.

In view of the above-described problems, an object of the present invention is to provide a vertical trench IGBT and a method for manufacturing the same which can improve the RBSOA capacity.

According to the present invention, a method for manufacturing a vertical trench IGBT includes: forming a body layer of a second conductivity type on a semiconductor substrate of a first conductivity type; forming a trench passing through the body layer; forming a trench gate in the trench via a gate insulating film; forming a polysilicon film containing an impurity of a first conductivity type on the body layer; diffusing the impurity from the polysilicon film into the body layer to form an emitter layer of a first conductivity type on the body layer; and forming a collector layer of a second conductivity type on a lower surface of the semiconductor substrate.

The present invention makes it possible to improve the RBSOA capacity.

Other and further objects, features and advantages of the invention will appear more fully from the following description.

DETAILED DESCRIPTION OF THE PREFERRED EMBODIMENTS

A vertical trench IGBT and a method for manufacturing the same according to the embodiments of the present invention will be described with reference to the drawings. The same components will be denoted by the same symbols, and the repeated description thereof may be omitted.

First Embodiment

Figure 1:
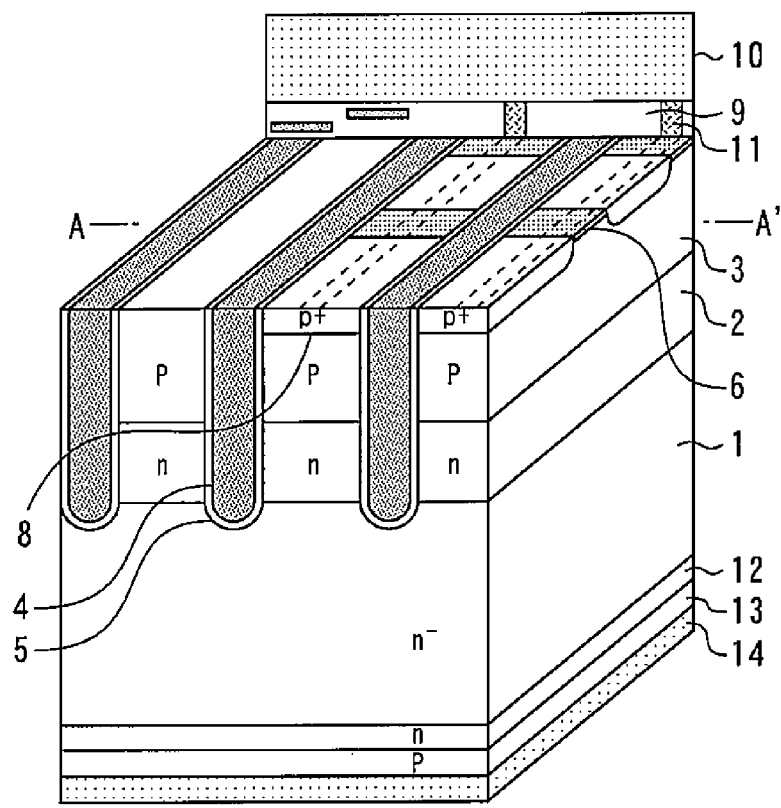
FIG. 1 is a perspective view showing a vertical trench IGBT according to the first embodiment of the present invention.
Figure 2:
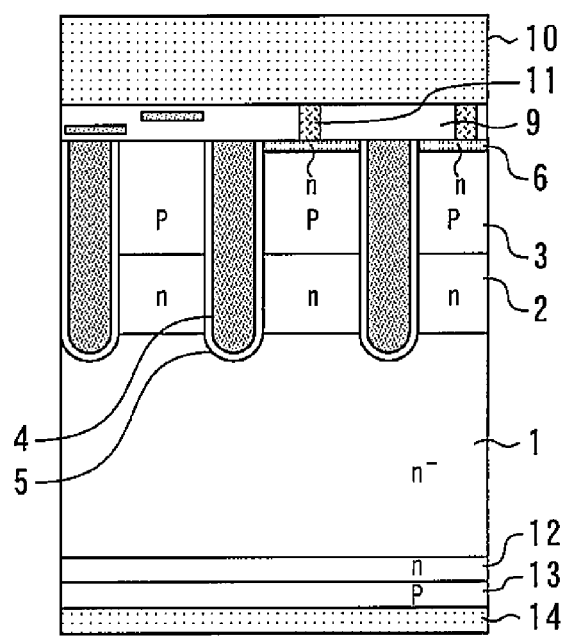
FIG. 2 is a sectional view taken along the line A A' in FIG. 1.

FIG. 1 is a perspective view showing a vertical trench IGBT according to the first embodiment of the present invention. FIG. 2 is a sectional view taken along the line A-A' in FIG. 1. An n-type charge accumulating layer 2 and a p-type body layer 3 are sequentially provided on the n$^-$-type Si substrate 1. Trench gates 4 are provided in trenches passing through the p-type body layer 3 via gate insulating films 5. The trench gates 4 are provided in stripes in planar view.

An n-type emitter layer 6 and a p$^+$-type diffusion layer 8 are provided on a p-type body layer 3. In planar view, the n-type emitter layer 6 and the p$^+$-type diffusion layer 8 are alternately arranged between adjacent trench gates 4 in the length direction of the trench gates 4.

The trench gates 4 are coated by an interlayer insulating film 9. An emitter electrode 10 is provided on the interlayer insulating film 9. Contact plugs 11 pass through the interlayer insulating film 9 and connect the p-type body layer 3 and the n-type emitter layer 6 and the emitter electrode 10. In planar view, the contact plugs 11 are arranged in parallel to the trench gates 4. An n-type buffer layer 12 and a p-type collector layer 13 are provided on the lower surface of the n$^-$-type Si substrate 1 in sequence. A collector electrode 14 is connected to the p-type collector layer 13.

Next, a method for fabricating the above-described IGBT will be described. FIGS. 3 to 9 are sectional views showing the method for fabricating the vertical trench IGBT according to the first embodiment of the present invention.

Figure 3:
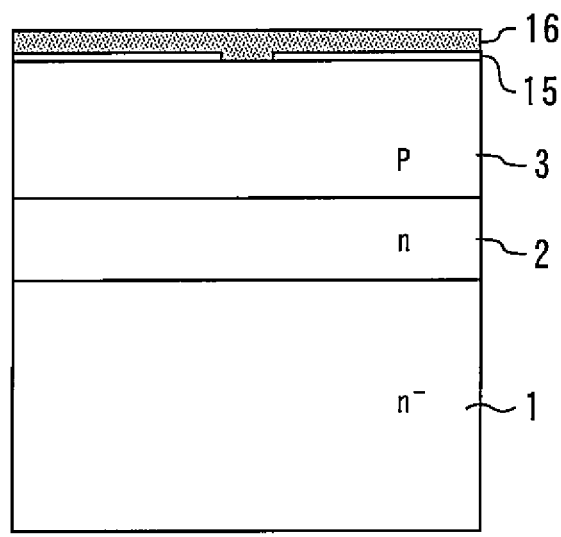
FIGS. 3 to 9 are sectional views showing the method for fabricating the vertical trench IGBT according to the first embodiment of the present invention.

Firstly, as shown in FIG. 3, an n-type charge accumulating layer 2 and p-type body layer 3 are sequentially formed on the n⁻-type Si substrate 1. A trench passing through the p-type body layer 3 is formed, and trench gates 4 are formed in the trench via the gate insulating film 5. An opening (pattern of the emitter layer) is formed in an oxide film 15 of a film thickness of 500 to 2000 Å deposited on the p-type body layer 3. A polysilicon film 16 (doped polysilicon or P/As injected polysilicon) of a film thickness of 500 to 5000 Å containing n-type impurities is formed on the oxide film 15, and the p-type body layer 3 exposed by the opening.

Figure 4:
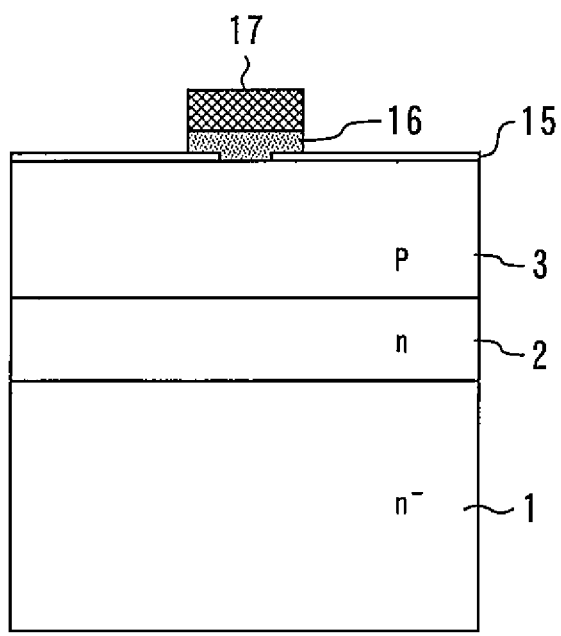
Figure 5:
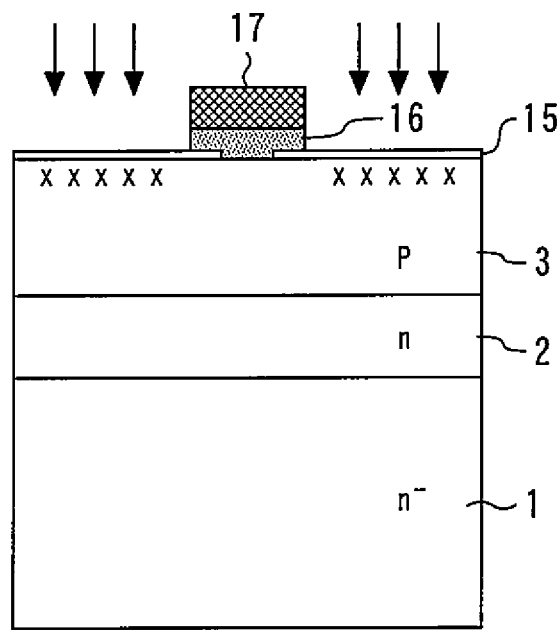

Next, as shown in FIG. 4, a resist film 17 is formed on the polysilicon film 16 in the region whereon the n-type emitter layer 6 is formed using a photoengraving process. The polysilicon film 16 is subjected to etching (patterning) using the resist film 17 as a mask. Then, as shown in FIG. 5, a p-type impurity is injected into the p-type body layer 3 using the resist film 17 as a mask by self-alignment.

Figure 6:
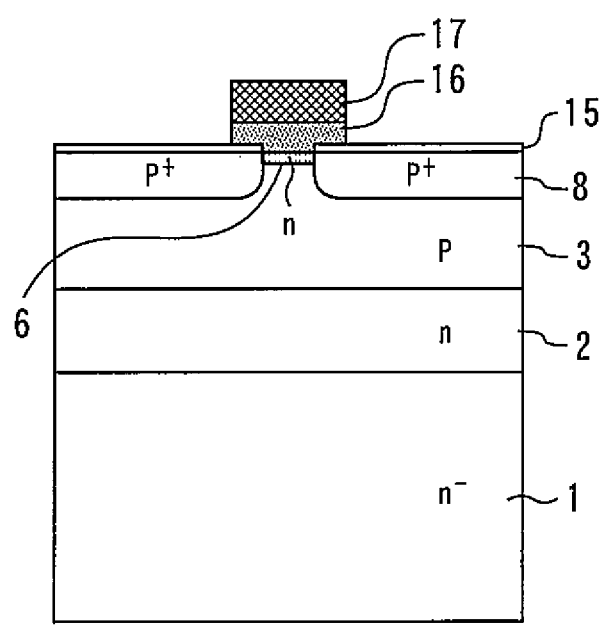
Figure 7:
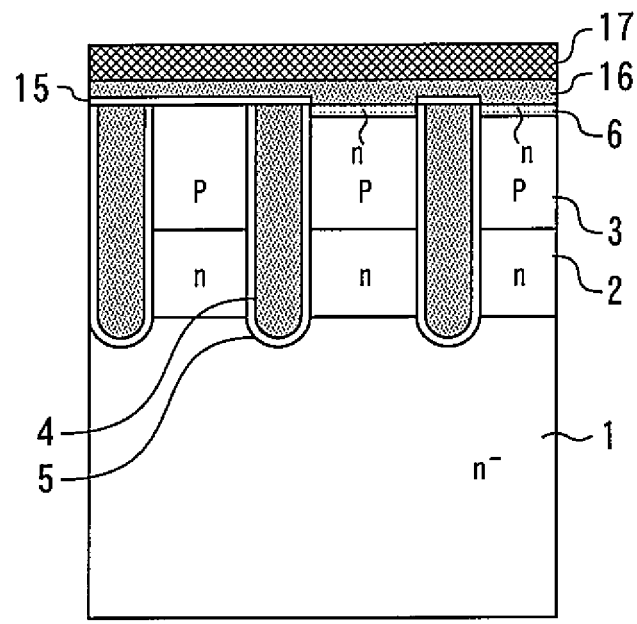
Figure 8:
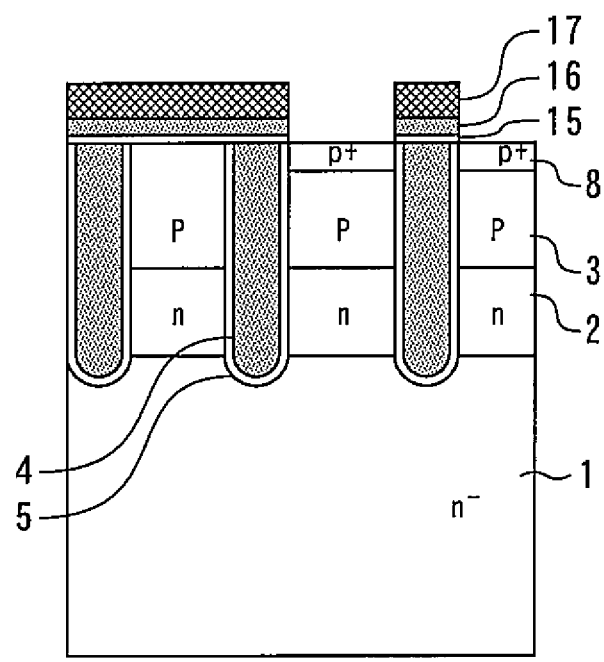

Subsequently, as shown in FIGS. 6 to 8, a heat treatment is performed to diffuse an n-type impurity from the polysilicon film 16 into the p-type body layer 3 to form an n-type emitter layer 6 on the p-type body layer 3. Then, a p⁺-type diffusion layer 8 is formed on the region of the p-type body layer 3 wherein the p-type impurity is implanted. FIG. 6 is a sectional view in the length direction of the trench. FIG. 7 is a sectional view in the vertical direction of the trench in the n-type emitter layer 6. FIG. 8 is a sectional view in the vertical direction of the trench in the p⁺-type diffusion layer 8. The n-type emitter layer 6 may be formed by performing a heat treatment before patterning the polysilicon film 16.

Figure 9:
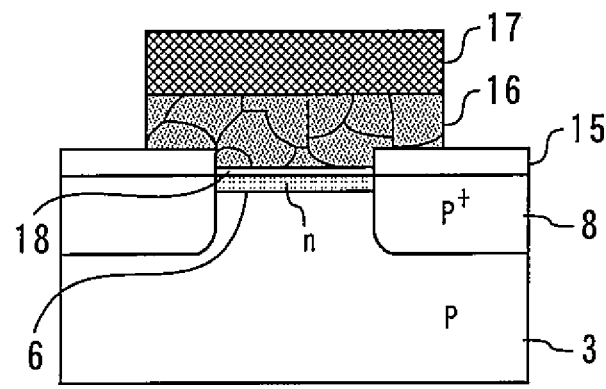

Here, since the diffusion of impurities from the grain boundary of the polysilicon film 16 is dominant, the grain size of the polysilicon film 16 is made to be smaller than the width of the n-type emitter layer 6 as shown in FIG. 9. Thereby, the concentration and the depth of the n-type emitter layer 6 become stable. In addition, a natural oxide film 18 is formed between the p-type body layer 3 and the polysilicon film 16. Thereby, the depth of the n-type emitter layer 6 can be controlled.

Thereafter, an n-type buffer layer, a p-type collector layer 13, and a collector electrode 14 are formed on the lower surface of the n⁻-type Si substrate 1. By the above-described processes, the vertical trench IGBT according to the present embodiment is fabricated.

Figure 10:
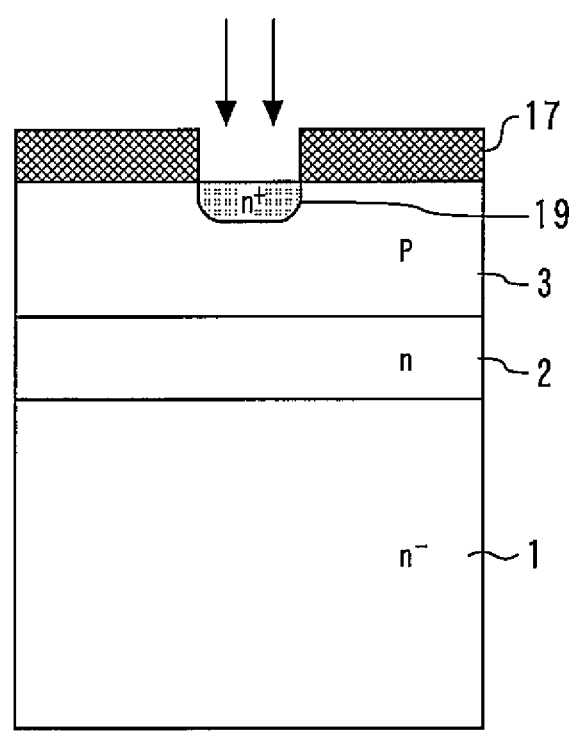
FIG. 10 is a sectional view showing the method for fabricating a trench IGBT according to the comparative example.
Figure 11:
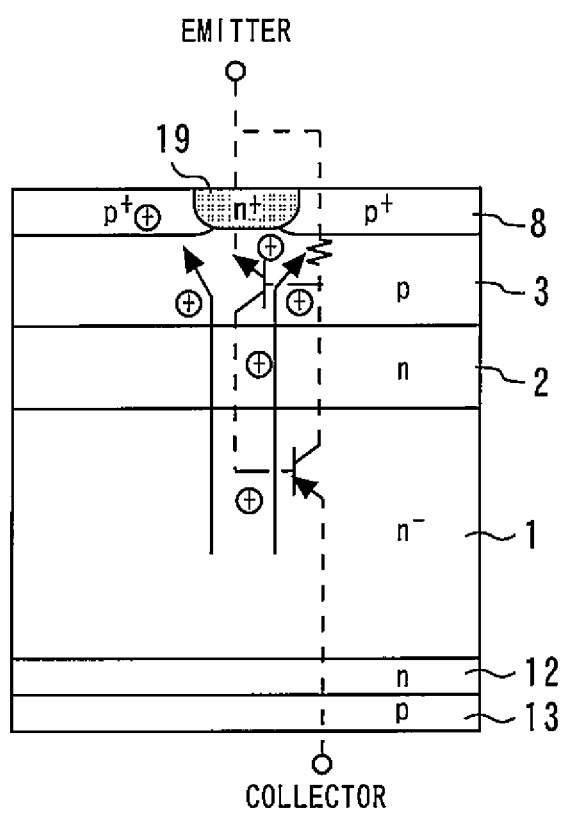
FIG. 11 is a sectional view for describing the operation of the trench IGBT according to the comparative example.

Next, the effect of the present embodiment will be described in comparison with the effect of a comparative example. FIG. 10 is a sectional view showing the method for fabricating a trench IGBT according to the comparative example. FIG. 11 is a sectional view for describing the operation of the trench IGBT according to the comparative example. In the comparative example, since the n⁺-type emitter layer 19 is formed by the implantation of impurities and the heat treatment, the n⁺-type emitter layer 19 cannot be shallowly formed. Therefore, during the reverse bias interrupting of the IGBT, holes are stored immediately under the n⁺-type emitter layer 19 and when the NPN transistor is turned ON, the latch-up operation starts.

In the present embodiment on the other hand, by the diffusion of impurities from the polysilicon film 16, very shallow and fine n-type emitter layer 6 can be formed. Therefore, holes are not accumulated immediately under the n-type emitter layer 6 during the reverse bias interrupting of the IGBT, and the problems of latch-up when the NPN transistor is turned OFF do not occur. Thereby, the RBSOA capacity can be improved.

Furthermore, by forming the n-type emitter layer 6 and the p⁺-type diffusion layer 8 using self-alignment, the superposition of the both can be formed with a high degree of accuracy. Thereby, the joining variation of the both decreases, the current variation decreases, and the RBSOA capacity can be stabilized.

Figure 12:
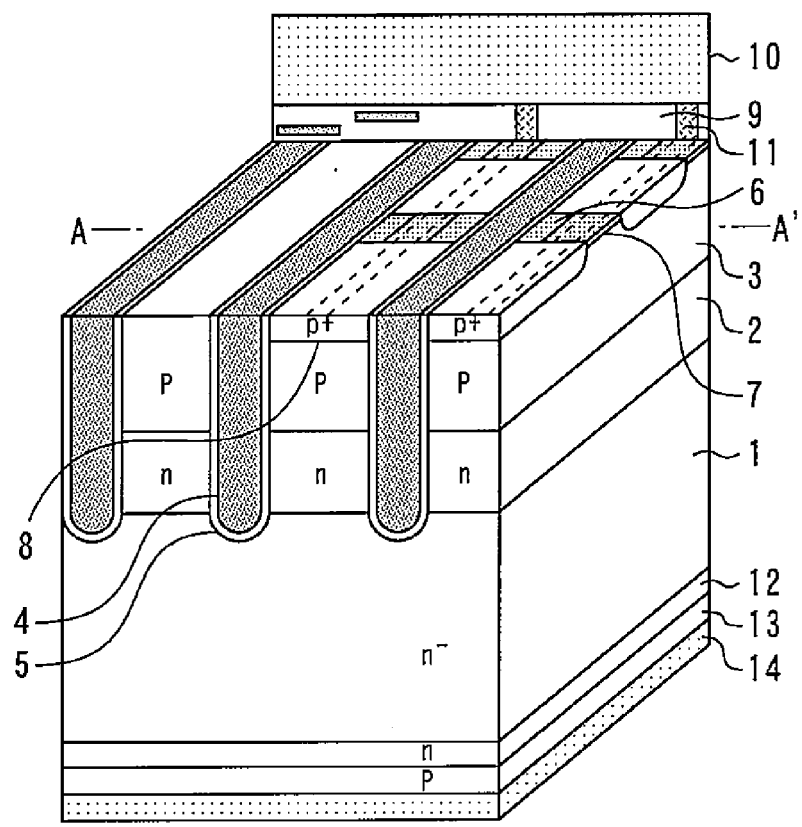
FIG. 12 is a perspective view showing a deformation example of the vertical trench IGBT according to the first embodiment of the present invention.
Figure 13:
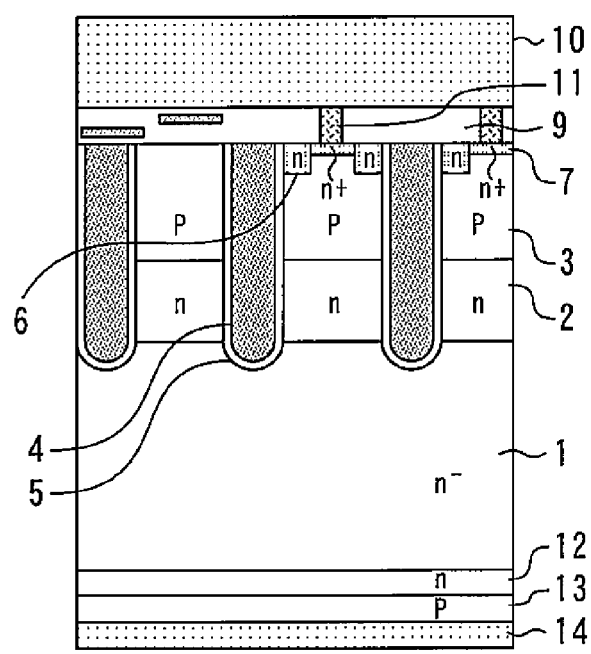
FIG. 13 is a sectional view taken along the line A A' in FIG. 12.

FIG. 12 is a perspective view showing a deformation example of the vertical trench IGBT according to the first embodiment of the present invention. FIG. 13 is a sectional view taken along the line A-A' in FIG. 12. In this deformation example, the emitter layer is divided into an n-type emitter layer 6 and an n⁺-type emitter layer 7. The n-type emitter layer 6 is a true emitter layer formed in the vicinity of the trench gate 4, and the n⁺-type emitter layer 7 is an exterior emitter layer for extruding the true emitter layer. In this case also, the effect of the first embodiment can be obtained. In addition, if the n-type emitter layer 6 and the n⁺-type emitter layer 7 are separately formed by diffusion of impurities from the polysilicon film, the MOS (Metal Oxide Semiconductor) can be individually controlled.

Second Embodiment

Figure 14:
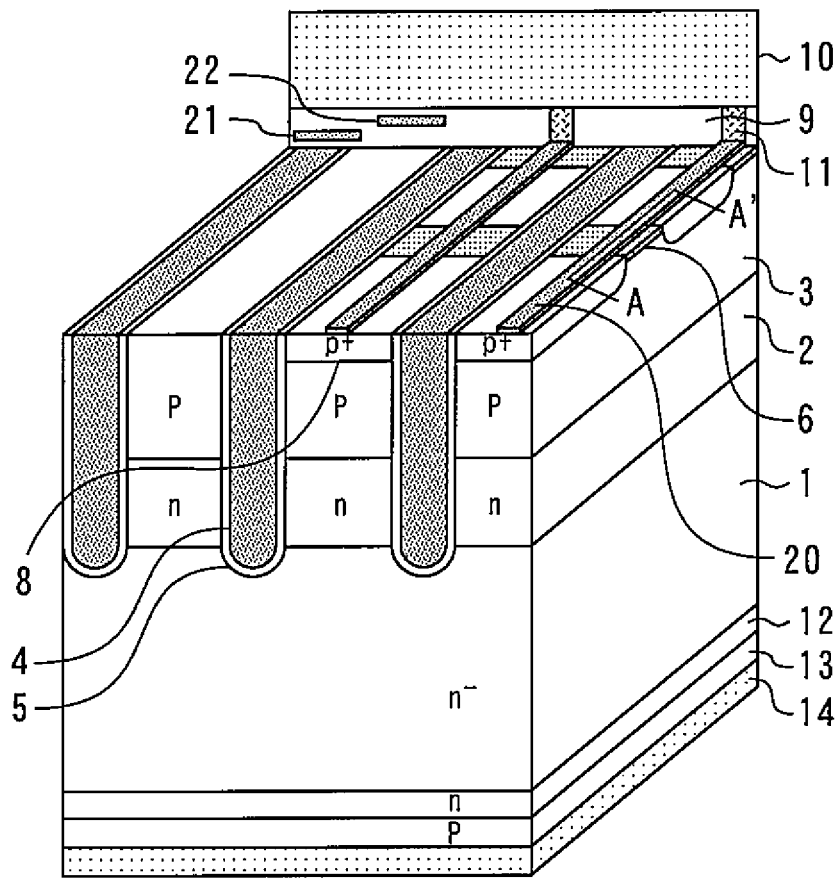
FIG. 14 is a perspective view showing the vertical trench IGBT according to the second embodiment of the present invention.
Figure 15:
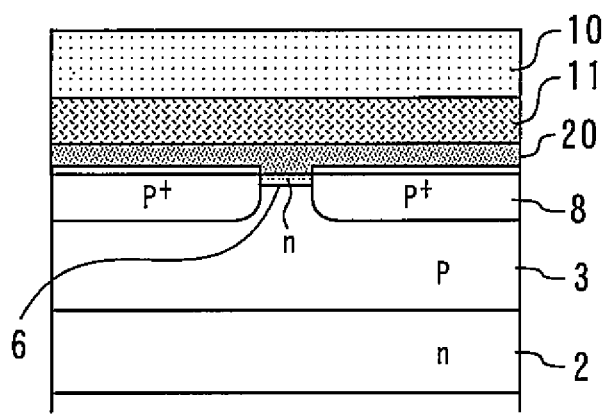
FIG. 15 is a sectional view taken along the line A A' in FIG. 14.

FIG. 14 is a perspective view showing the vertical trench IGBT according to the second embodiment of the present invention. FIG. 15 is a sectional view taken along the line A-A' in FIG. 14. A polysilicon film 20 having a film thickness of 500 to 5000 Å is provided between the p-type body layer 3 and between the n-type emitter layer 6 and a contact plug 11.

By this polysilicon film 20, the stress by the trench gate 4 and the contact plug 11 in fine cells can be reduced. Thereby, increase of the default into the Si substrate can be suppressed. As a result, since the leakage current into connection is reduced, the RBSOA capacity can be improved.

In addition, in the first and second embodiments, it is favorable that the polysilicon films 16 and 20 are simultaneously formed together with the polysilicon to constitute the trench gate 4, the polysilicon to constitute the electrode 21 of the Poly-Poly capacitor, and a polysilicon resistor 22. Thereby, the number of processes can be reduced.

Furthermore, the vertical trench IGBT is not limited to be formed of silicon, but can be formed of a wide-gap semiconductor having a larger band gap in comparison to silicon. Wide-gap semiconductors include, for example, silicon carbide, gallium nitride related materials, or diamond. Since vertical trench IGBTs formed of such wide-gap semiconductors have high breakdown characteristics or high allowable current densities, and can be down-sized. By using such down-sized elements, semiconductor modules incorporating such elements can also be down-sized. In addition, since the heat resistance of the elements is high, the heat dissipation fin in heat sinks can be down-sized, and water cooling can be changed to air cooling, semiconductor modules can be further down-sized. Moreover, since the power loss by elements is low, and is highly effective, the effect of semiconductor modules can be elevated.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-052580, filed on Mar. 9, 2012 including specification, claims, drawings and summary, on which the Convention priority of the present application is based, are incorporated herein by reference in its entirety.

What is claimed is:

1. A method for manufacturing a vertical trench IGBT comprising:

forming a body layer of a second conductivity type on a semiconductor substrate of a first conductivity type;

forming a trench passing through the body layer;

forming a trench gate in the trench via a gate insulating film;

forming a substantially planar polysilicon film containing an impurity of a first conductivity type on the body layer;

diffusing the impurity from the polysilicon film into the body layer to form an emitter layer of a first conductivity type on the body layer; and forming a collector layer of a second conductivity type on a lower surface of the semiconductor substrate, wherein the emitter layer includes a true emitter layer formed in the vicinity of the trench gate, and an exterior emitter layer for extruding the true emitter layer.

2. The method for manufacturing a vertical trench IGBT according to claim 1, further comprising:

forming a resist film on the polysilicon film in a region whereon the emitter layer is formed;

etching the polysilicon film using the resist film as a mask;

after etching the polysilicon film, injecting an impurity of a second conductivity type into the body layer using the resist film as a mask; and performing a heat treatment to form a diffusion layer of a second conductivity type on a region of the body layer wherein the impurity of a second conductivity type is implanted.

3. The method for manufacturing a vertical trench IGBT according to claim 1, wherein a natural oxide film is formed between the body layer and the polysilicon film.

4. The method for manufacturing a vertical trench IGBT according to claim 1, wherein the polysilicon film is simultaneously formed together with a polysilicon which constitutes the trench gate.

5. The method for manufacturing a vertical trench IGBT according to claim 1, wherein the polysilicon film is simultaneously formed together with a polysilicon which constitutes an electrode of a capacitor.

6. The method for manufacturing a vertical trench IGBT according to claim 1, wherein the polysilicon film is simultaneously formed together with a polysilicon resistor.

7. A method for manufacturing a vertical trench IGBT comprising:

forming a body layer of a second conductivity type on a semiconductor substrate of a first conductivity type;

forming a trench passing through the body layer;

forming a trench gate in the trench via a gate insulating film;

forming a polysilicon film containing an impurity of a first conductivity type on the body layer;

diffusing the impurity from the polysilicon film into the body layer to form an emitter layer of a first conductivity type on the body layer; and forming a collector layer of a second conductivity type on a lower surface of the semiconductor substrate, wherein a grain size of the polysilicon film is smaller than a width of the emitter layer.

* * * * *